US009318090B2

(12) United States Patent
Zhou et al.

(10) Patent No.: US 9,318,090 B2
(45) Date of Patent: Apr. 19, 2016

(54) DOWNLINK TONE DETECTION AND ADAPTATION OF A SECONDARY PATH RESPONSE MODEL IN AN ADAPTIVE NOISE CANCELING SYSTEM

(71) Applicant: Cirrus Logic, Inc., Austin, TX (US)

(72) Inventors: Dayong Zhou, Austin, TX (US); Yang Lu, Austin, TX (US); Jon D. Hendrix, Wimberly, TX (US); Jeffrey Alderson, Austin, TX (US); Antonio John Miller, Austin, TX (US); Chin Yong, Austin, TX (US); Gautham Devendra Kamath, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 529 days.

(21) Appl. No.: 13/729,141

(22) Filed: Dec. 28, 2012

(65) Prior Publication Data

US 2013/0301848 A1 Nov. 14, 2013

Related U.S. Application Data

(60) Provisional application No. 61/645,333, filed on May 10, 2012, provisional application No. 61/701,187, filed on Sep. 14, 2012.

(51) Int. Cl.

| | |
|---|---|
| ***G10K 11/16*** | (2006.01) |
| ***H03B 29/00*** | (2006.01) |
| ***G10K 11/178*** | (2006.01) |

(52) U.S. Cl.

CPC .............. *G10K 11/16* (2013.01); *G10K 11/178* (2013.01); *G10K 11/1784* (2013.01); *G10K 2210/00* (2013.01); *G10K 2210/108* (2013.01); *G10K 2210/503* (2013.01)

(58) Field of Classification Search

CPC . G10K 11/16; G10K 11/1784; G10K 11/178; G10K 2210/00; G10K 2210/108; G10K 2210/505; G10K 2210/511; G10K 2210/3022; G10K 2210/3023; G10K 2210/3026; G10K 11/1782; G10K 11/175

USPC ................ 381/71.1, 71.2, 71.8, 71.11, 71.12, 381/71.14, 71.6; 700/94; 704/233, 229

See application file for complete search history.

(56) References Cited

U.S. PATENT DOCUMENTS

| | | | |
|---|---|---|---|
| 4,020,567 | A | 5/1977 | Webster |
| 4,926,464 | A | 5/1990 | Schley-May |

(Continued)

FOREIGN PATENT DOCUMENTS

| | | | |
|---|---|---|---|
| DE | 102011013343 | A1 | 9/2012 |
| EP | 0412902 | A2 | 2/1991 |

(Continued)

OTHER PUBLICATIONS

Black, John W., "An Application of Side-Tone in Subjective Tests of Microphones and Headsets", Project Report No. NM 001 064.01.20, Research Report of the U.S. Naval School of Aviation Medicine, Feb. 1, 1954, 12 pages (pp. 1-12 in pdf), Pensacola, FL, US.

(Continued)

*Primary Examiner* — Vivian Chin
*Assistant Examiner* — Ubachukwu Odunukwe
(74) *Attorney, Agent, or Firm* — Mitch Harris, Atty at Law, LLC; Andrew M. Harris

(57) ABSTRACT

An adaptive noise canceling (ANC) circuit adaptively generates an anti-noise signal from a reference microphone signal that is injected into the speaker or other transducer output to cause cancellation of ambient audio sounds. An error microphone proximate the speaker provides an error signal. A secondary path estimating adaptive filter estimates the electro-acoustical path from the noise canceling circuit through the transducer so that source audio can be removed from the error signal. Tones in the source audio, such as remote ringtones, present in downlink audio during initiation of a telephone call, are detected by a tone detector using accumulated tone persistence and non-silence hangover counting, and adaptation of the secondary path estimating adaptive filter is halted to prevent adapting to the tones. Adaptation of the adaptive filters is then sequenced so any disruption of the secondary path adaptive filter response is removed before allowing the anti-noise generating filter to adapt.

27 Claims, 8 Drawing Sheets

(56) References Cited

U.S. PATENT DOCUMENTS

| | | | |
|---|---|---|---|
| 4,998,241 | A | 3/1991 | Brox et al. |
| 5,018,202 | A | 5/1991 | Takahashi |
| 5,021,753 | A | 6/1991 | Chapman |
| 5,044,373 | A | 9/1991 | Northeved et al. |
| 5,117,401 | A | 5/1992 | Feintuch |
| 5,251,263 | A | 10/1993 | Andrea et al. |
| 5,278,913 | A | 1/1994 | Delfosse et al. |
| 5,321,759 | A | 6/1994 | Yuan |
| 5,337,365 | A | 8/1994 | Hamabe et al. |
| 5,359,662 | A | 10/1994 | Yuan et al. |
| 5,377,276 | A | 12/1994 | Terai et al. |
| 5,386,477 | A | 1/1995 | Popovich et al. |
| 5,410,605 | A | 4/1995 | Sawada et al. |
| 5,425,105 | A | 6/1995 | Lo et al. |
| 5,445,517 | A | 8/1995 | Kondou et al. |
| 5,465,413 | A | 11/1995 | Enge et al. |
| 5,481,615 | A | 1/1996 | Eatwell et al. |
| 5,548,681 | A | 8/1996 | Gleaves et al. |
| 5,550,925 | A | 8/1996 | Hori et al. |
| 5,559,893 | A | 9/1996 | Krokstad et al. |
| 5,586,190 | A | 12/1996 | Trantow et al. |
| 5,640,450 | A | 6/1997 | Watanabe |
| 5,668,747 | A | 9/1997 | Ohashi |
| 5,687,075 | A | 11/1997 | Stothers |
| 5,696,831 | A | 12/1997 | Inanaga et al. |
| 5,699,437 | A | 12/1997 | Finn |
| 5,706,344 | A | 1/1998 | Finn |
| 5,740,256 | A | 4/1998 | Castello Da Costa et al. |
| 5,768,124 | A | 6/1998 | Stothers et al. |
| 5,815,582 | A | 9/1998 | Claybaugh et al. |
| 5,832,095 | A | 11/1998 | Daniels |
| 5,852,667 | A | 12/1998 | Pan et al. |
| 5,909,498 | A | 6/1999 | Smith |
| 5,940,519 | A | 8/1999 | Kuo |
| 5,946,391 | A | 8/1999 | Dragwidge et al. |
| 5,991,418 | A | 11/1999 | Kuo |
| 6,041,126 | A | 3/2000 | Terai et al. |
| 6,118,878 | A | 9/2000 | Jones |
| 6,181,801 | B1 | 1/2001 | Puthuff et al. |
| 6,219,427 | B1 | 4/2001 | Kates et al. |
| 6,278,786 | B1 | 8/2001 | McIntosh |
| 6,282,176 | B1 | 8/2001 | Hemkumar |
| 6,304,179 | B1 | 10/2001 | Lolito et al. |
| 6,317,501 | B1 | 11/2001 | Matsuo |
| 6,418,228 | B1 | 7/2002 | Terai et al. |
| 6,434,246 | B1 | 8/2002 | Kates et al. |
| 6,434,247 | B1 | 8/2002 | Kates et al. |
| 6,445,799 | B1 | 9/2002 | Taenzer et al. |
| 6,522,746 | B1 | 2/2003 | Marchok et al. |
| 6,542,436 | B1 | 4/2003 | Myllyla |
| 6,650,701 | B1 | 11/2003 | Hsiang et al. |
| 6,683,960 | B1 | 1/2004 | Fujii et al. |
| 6,738,482 | B1 | 5/2004 | Jaber |
| 6,766,292 | B1 | 7/2004 | Chandran |
| 6,768,795 | B2 | 7/2004 | Feltstrom et al. |
| 6,792,107 | B2 | 9/2004 | Tucker et al. |
| 6,850,617 | B1 | 2/2005 | Weigand |
| 6,940,982 | B1 | 9/2005 | Watkins |
| 7,016,504 | B1 | 3/2006 | Shennib |
| 7,058,463 | B1 | 6/2006 | Ruha et al. |
| 7,103,188 | B1 | 9/2006 | Jones |
| 7,181,030 | B2 | 2/2007 | Rasmussen et al. |
| 7,330,739 | B2 | 2/2008 | Somayajula |
| 7,365,669 | B1 | 4/2008 | Melanson |
| 7,466,838 | B1 | 12/2008 | Mosely |
| 7,680,456 | B2 | 3/2010 | Muhammad et al. |
| 7,742,746 | B2 | 6/2010 | Xiang et al. |
| 7,742,790 | B2 | 6/2010 | Konchitsky et al. |
| 7,817,808 | B2 | 10/2010 | Konchitsky et al. |
| 7,953,231 | B2 | 5/2011 | Ishida |
| 8,019,050 | B2 | 9/2011 | Mactavish et al. |
| 8,085,966 | B2 | 12/2011 | Amsel |
| D666,169 | S | 8/2012 | Tucker et al. |
| 8,249,262 | B2 | 8/2012 | Chua et al. |
| 8,251,903 | B2 | 8/2012 | LeBoeuf et al. |
| 8,290,537 | B2 | 10/2012 | Lee et al. |
| 8,325,934 | B2 | 12/2012 | Kuo |
| 8,331,604 | B2 | 12/2012 | Saito et al. |
| 8,374,358 | B2 | 2/2013 | Buck et al. |
| 8,379,884 | B2 | 2/2013 | Horibe et al. |
| 8,401,200 | B2 | 3/2013 | Tiscareno et al. |
| 8,442,251 | B2 | 5/2013 | Jensen et al. |
| 8,559,661 | B2 | 10/2013 | Tanghe |
| 8,600,085 | B2 | 12/2013 | Chen et al. |
| 8,775,172 | B2 | 7/2014 | Konchitsky et al. |
| 8,804,974 | B1 * | 8/2014 | Melanson ...................... 381/57 |
| 8,831,239 | B2 | 9/2014 | Bakalos |
| 8,842,848 | B2 | 9/2014 | Donaldson et al. |
| 8,855,330 | B2 | 10/2014 | Taenzer |
| 8,908,877 | B2 | 12/2014 | Abdollahzadeh Milani et al. |
| 8,942,976 | B2 | 1/2015 | Li et al. |
| 8,977,545 | B2 | 3/2015 | Zeng et al. |
| 9,066,176 | B2 | 6/2015 | Hendrix et al. |
| 9,071,724 | B2 | 6/2015 | Do et al. |
| 9,082,391 | B2 | 7/2015 | Yermeche et al. |
| 9,129,586 | B2 | 9/2015 | Bajic et al. |
| 2001/0053228 | A1 | 12/2001 | Jones |
| 2002/0003887 | A1 | 1/2002 | Zhang et al. |
| 2003/0063759 | A1 | 4/2003 | Brennan et al. |
| 2003/0072439 | A1 | 4/2003 | Gupta |
| 2003/0185403 | A1 | 10/2003 | Sibbald |
| 2004/0047464 | A1 | 3/2004 | Yu et al. |
| 2004/0120535 | A1 | 6/2004 | Woods |
| 2004/0165736 | A1 | 8/2004 | Hetherington et al. |
| 2004/0167777 | A1 | 8/2004 | Hetherington et al. |
| 2004/0202333 | A1 | 10/2004 | Csermak et al. |
| 2004/0240677 | A1 | 12/2004 | Onishi et al. |
| 2004/0242160 | A1 | 12/2004 | Ichikawa et al. |
| 2004/0264706 | A1 | 12/2004 | Ray et al. |
| 2005/0004796 | A1 | 1/2005 | Trump et al. |
| 2005/0018862 | A1 | 1/2005 | Fisher |
| 2005/0117754 | A1 | 6/2005 | Sakawaki |
| 2005/0207585 | A1 | 9/2005 | Christoph |
| 2005/0240401 | A1 | 10/2005 | Ebenezer |
| 2006/0018460 | A1 | 1/2006 | McCree |
| 2006/0035593 | A1 | 2/2006 | Leeds |
| 2006/0055910 | A1 | 3/2006 | Lee |
| 2006/0069556 | A1 | 3/2006 | Nadjar et al. |
| 2006/0153400 | A1 | 7/2006 | Fujita et al. |
| 2006/0159282 | A1 | 7/2006 | Borsch |
| 2006/0161428 | A1 * | 7/2006 | Fouret ................ H03H 21/0012 704/229 |
| 2006/0251266 | A1 | 11/2006 | Saunders et al. |
| 2007/0030989 | A1 | 2/2007 | Kates |
| 2007/0033029 | A1 | 2/2007 | Sakawaki |
| 2007/0038441 | A1 | 2/2007 | Inoue et al. |
| 2007/0047742 | A1 | 3/2007 | Taenzer et al. |
| 2007/0053524 | A1 | 3/2007 | Haulick et al. |
| 2007/0076896 | A1 | 4/2007 | Hosaka et al. |
| 2007/0154031 | A1 | 7/2007 | Avendano et al. |
| 2007/0258597 | A1 | 11/2007 | Rasmussen et al. |
| 2007/0297620 | A1 | 12/2007 | Choy |
| 2008/0019548 | A1 | 1/2008 | Avendano |
| 2008/0101589 | A1 | 5/2008 | Horowitz et al. |
| 2008/0107281 | A1 | 5/2008 | Togami et al. |
| 2008/0144853 | A1 | 6/2008 | Sommerfeldt et al. |
| 2008/0177532 | A1 | 7/2008 | Greiss et al. |
| 2008/0181422 | A1 | 7/2008 | Christoph |
| 2008/0226098 | A1 | 9/2008 | Haulick et al. |
| 2008/0240413 | A1 | 10/2008 | Mohammad et al. |
| 2008/0240455 | A1 | 10/2008 | Inoue et al. |
| 2008/0240457 | A1 | 10/2008 | Inoue et al. |
| 2008/0269926 | A1 | 10/2008 | Xiang et al. |
| 2009/0012783 | A1 | 1/2009 | Klein |
| 2009/0034748 | A1 | 2/2009 | Sibbald |
| 2009/0041260 | A1 | 2/2009 | Jorgensen et al. |
| 2009/0046867 | A1 | 2/2009 | Clemow |
| 2009/0060222 | A1 | 3/2009 | Jeong et al. |
| 2009/0080670 | A1 | 3/2009 | Solbeck et al. |
| 2009/0086990 | A1 | 4/2009 | Christoph |
| 2009/0175461 | A1 | 7/2009 | Nakamura et al. |
| 2009/0175466 | A1 | 7/2009 | Elko et al. |
| 2009/0196429 | A1 | 8/2009 | Ramakrishnan et al. |
| 2009/0220107 | A1 | 9/2009 | Every et al. |

(56) References Cited

U.S. PATENT DOCUMENTS

| | | | | |
|---|---|---|---|---|
| 2009/0238369 | A1 | 9/2009 | Ramakrishnan et al. | |
| 2009/0245529 | A1 | 10/2009 | Asada et al. | |
| 2009/0254340 | A1 | 10/2009 | Sun et al. | |
| 2009/0290718 | A1 | 11/2009 | Kahn et al. | |
| 2009/0296965 | A1 | 12/2009 | Kojima | |
| 2009/0304200 | A1 | 12/2009 | Kim et al. | |
| 2009/0311979 | A1 | 12/2009 | Husted et al. | |
| 2010/0002891 | A1 | 1/2010 | Shiraishi et al. | |
| 2010/0014683 | A1 | 1/2010 | Maeda et al. | |
| 2010/0014685 | A1 | 1/2010 | Wurm | |
| 2010/0061564 | A1 | 3/2010 | Clemow et al. | |
| 2010/0069114 | A1 | 3/2010 | Lee et al. | |
| 2010/0082339 | A1 | 4/2010 | Konchitsky et al. | |
| 2010/0098263 | A1 | 4/2010 | Pan et al. | |
| 2010/0098265 | A1 | 4/2010 | Pan et al. | |
| 2010/0124335 | A1 | 5/2010 | Wessling et al. | |
| 2010/0124336 | A1 | 5/2010 | Shridhar et al. | |
| 2010/0124337 | A1 | 5/2010 | Wertz et al. | |
| 2010/0131269 | A1 | 5/2010 | Park et al. | |
| 2010/0142715 | A1 | 6/2010 | Goldstein et al. | |
| 2010/0150367 | A1 | 6/2010 | Mizuno | |
| 2010/0158330 | A1 | 6/2010 | Guissin et al. | |
| 2010/0166203 | A1 | 7/2010 | Peissig et al. | |
| 2010/0195838 | A1 | 8/2010 | Bright | |
| 2010/0195844 | A1 | 8/2010 | Christoph et al. | |
| 2010/0207317 | A1 | 8/2010 | Iwami et al. | |
| 2010/0239126 | A1 | 9/2010 | Grafenberg et al. | |
| 2010/0246855 | A1 | 9/2010 | Chen | |
| 2010/0260345 | A1 | 10/2010 | Shridhar et al. | |
| 2010/0266137 | A1 | 10/2010 | Sibbald et al. | |
| 2010/0272276 | A1 | 10/2010 | Carreras et al. | |
| 2010/0272283 | A1 | 10/2010 | Carreras et al. | |
| 2010/0274564 | A1 | 10/2010 | Bakalos et al. | |
| 2010/0284546 | A1 | 11/2010 | DeBrunner et al. | |
| 2010/0291891 | A1 | 11/2010 | Ridgers et al. | |
| 2010/0296666 | A1 | 11/2010 | Lin | |
| 2010/0296668 | A1 | 11/2010 | Lee et al. | |
| 2010/0310086 | A1 | 12/2010 | Magrath et al. | |
| 2010/0322430 | A1 | 12/2010 | Isberg | |
| 2011/0007907 | A1 | 1/2011 | Park et al. | |
| 2011/0026724 | A1 | 2/2011 | Doclo | |
| 2011/0099010 | A1 | 4/2011 | Zhang | |
| 2011/0106533 | A1 | 5/2011 | Yu | |
| 2011/0116654 | A1 | 5/2011 | Chan et al. | |
| 2011/0129098 | A1 | 6/2011 | Delano et al. | |
| 2011/0130176 | A1 | 6/2011 | Magrath et al. | |
| 2011/0142247 | A1 | 6/2011 | Fellers et al. | |
| 2011/0144984 | A1 | 6/2011 | Konchitsky | |
| 2011/0158419 | A1 | 6/2011 | Theverapperuma et al. | |
| 2011/0206214 | A1 | 8/2011 | Christoph et al. | |
| 2011/0222698 | A1 | 9/2011 | Asao et al. | |
| 2011/0249826 | A1 | 10/2011 | Van Leest | |
| 2011/0288860 | A1 | 11/2011 | Schevciw et al. | |
| 2011/0293103 | A1 | 12/2011 | Park et al. | |
| 2011/0299695 | A1* | 12/2011 | Nicholson | G10K 11/1782 381/71.6 |
| 2011/0305347 | A1 | 12/2011 | Wurm | |
| 2011/0317848 | A1 | 12/2011 | Ivanov et al. | |
| 2012/0135787 | A1 | 5/2012 | Kusunoki et al. | |
| 2012/0140917 | A1 | 6/2012 | Nicholson et al. | |
| 2012/0140942 | A1 | 6/2012 | Loeda | |
| 2012/0140943 | A1* | 6/2012 | Hendrix | G10K 11/1782 381/71.11 |
| 2012/0148062 | A1 | 6/2012 | Scarlett et al. | |
| 2012/0155666 | A1 | 6/2012 | Nair | |
| 2012/0170766 | A1 | 7/2012 | Alves et al. | |
| 2012/0207317 | A1 | 8/2012 | Abdollahzadeh Milani et al. | |
| 2012/0215519 | A1 | 8/2012 | Park et al. | |
| 2012/0250873 | A1 | 10/2012 | Bakalos et al. | |
| 2012/0259626 | A1 | 10/2012 | Li et al. | |
| 2012/0263317 | A1 | 10/2012 | Shin et al. | |
| 2012/0281850 | A1 | 11/2012 | Hyatt | |
| 2012/0300955 | A1 | 11/2012 | Iseki et al. | |
| 2012/0300958 | A1 | 11/2012 | Klemmensen | |
| 2012/0300960 | A1 | 11/2012 | Mackay et al. | |
| 2012/0308021 | A1 | 12/2012 | Kwatra et al. | |
| 2012/0308024 | A1 | 12/2012 | Alderson et al. | |
| 2012/0308025 | A1* | 12/2012 | Hendrix et al. | 381/71.11 |
| 2012/0308026 | A1 | 12/2012 | Kamath et al. | |
| 2012/0308027 | A1 | 12/2012 | Kwatra | |
| 2012/0308028 | A1 | 12/2012 | Kwatra et al. | |
| 2012/0310640 | A1* | 12/2012 | Kwatra et al. | 704/233 |
| 2013/0010982 | A1 | 1/2013 | Elko et al. | |
| 2013/0083939 | A1 | 4/2013 | Fellers et al. | |
| 2013/0195282 | A1 | 8/2013 | Ohita et al. | |
| 2013/0243198 | A1 | 9/2013 | Van Rumpt | |
| 2013/0243225 | A1 | 9/2013 | Yokota | |
| 2013/0272539 | A1 | 10/2013 | Kim et al. | |
| 2013/0287218 | A1 | 10/2013 | Alderson et al. | |
| 2013/0287219 | A1 | 10/2013 | Hendrix et al. | |
| 2013/0301842 | A1* | 11/2013 | Hendrix et al. | 381/71.1 |
| 2013/0301846 | A1* | 11/2013 | Alderson et al. | 381/71.7 |
| 2013/0301847 | A1* | 11/2013 | Alderson et al. | 381/71.11 |
| 2013/0301849 | A1* | 11/2013 | Alderson et al. | 381/71.11 |
| 2013/0315403 | A1 | 11/2013 | Samuelsson | |
| 2013/0343556 | A1 | 12/2013 | Bright | |
| 2013/0343571 | A1 | 12/2013 | Rayala et al. | |
| 2014/0016803 | A1 | 1/2014 | Puskarich | |
| 2014/0036127 | A1 | 2/2014 | Pong et al. | |
| 2014/0044275 | A1 | 2/2014 | Goldstein et al. | |
| 2014/0050332 | A1 | 2/2014 | Nielsen et al. | |
| 2014/0072134 | A1* | 3/2014 | Po et al. | 381/71.11 |
| 2014/0086425 | A1 | 3/2014 | Jensen et al. | |
| 2014/0146976 | A1 | 5/2014 | Rundle | |
| 2014/0169579 | A1 | 6/2014 | Azmi | |
| 2014/0177851 | A1 | 6/2014 | Kitazawa et al. | |
| 2014/0211953 | A1 | 7/2014 | Alderson et al. | |
| 2014/0270222 | A1 | 9/2014 | Hendrix et al. | |
| 2014/0270223 | A1 | 9/2014 | Li et al. | |
| 2014/0270224 | A1 | 9/2014 | Zhou et al. | |
| 2014/0294182 | A1 | 10/2014 | Axelsson et al. | |
| 2014/0307887 | A1 | 10/2014 | Alderson | |
| 2014/0307888 | A1 | 10/2014 | Alderson et al. | |
| 2014/0307890 | A1 | 10/2014 | Zhou et al. | |
| 2014/0314244 | A1 | 10/2014 | Yong | |
| 2014/0314247 | A1 | 10/2014 | Zhang | |
| 2014/0369517 | A1 | 12/2014 | Zhou et al. | |
| 2015/0092953 | A1 | 4/2015 | Abdollahzadeh Milani et al. | |
| 2015/0161981 | A1 | 6/2015 | Kwatra | |

FOREIGN PATENT DOCUMENTS

| | | | |
|---|---|---|---|
| EP | 1691577 | A2 | 8/2006 |
| EP | 1880699 | A2 | 1/2008 |
| EP | 1947642 | A1 | 7/2008 |
| EP | 2133866 | A1 | 12/2009 |
| EP | 2216774 | A1 | 8/2010 |
| EP | 2237573 | A1 | 10/2010 |
| EP | 2395500 | A1 | 12/2011 |
| EP | 2395501 | A1 | 12/2011 |
| EP | 2551845 | A1 | 1/2013 |
| GB | 2401744 | A | 11/2004 |
| GB | 2436657 | A | 10/2007 |
| GB | 2455821 | A | 6/2009 |
| GB | 2455824 | A | 6/2009 |
| GB | 2455828 | A | 6/2009 |
| GB | 2484722 | A | 4/2012 |
| JP | H06-186985 | A | 7/1994 |
| JP | 07104769 | | 4/1995 |
| JP | 07240989 | | 9/1995 |
| JP | 07325588 | | 12/1995 |
| JP | H11305783 | A | 11/1999 |
| JP | 2008015046 | A | 1/2008 |
| WO | WO 9113429 | | 9/1991 |
| WO | WO 9911045 | | 3/1999 |
| WO | WO 03/015074 | A1 | 2/2003 |
| WO | WO 03015275 | A1 | 2/2003 |
| WO | WO 2004009007 | A1 | 1/2004 |
| WO | WO 2004017303 | A1 | 2/2004 |
| WO | WO 2006128768 | A1 | 12/2006 |
| WO | WO 2007007916 | A1 | 1/2007 |
| WO | WO 2007011337 | | 1/2007 |
| WO | WO 2007110807 | A2 | 10/2007 |
| WO | WO 2007113487 | A1 | 11/2007 |

(56) References Cited

FOREIGN PATENT DOCUMENTS

WO WO 2010117714 A1 10/2010
WO WO 2010131154 A1 11/2010
WO WO 2012134874 A1 10/2012
WO WO 2015038255 A1 3/2015

OTHER PUBLICATIONS

Peters, Robert W., "The Effect of High-Pass and Low-Pass Filtering of Side-Tone Upon Speaker Intelligibility", Project Report No. NM 001 064.01.25, Research Report of the U.S. Naval School of Aviation Medicine, Aug. 16, 1954, 13 pages (pp. 1-13 in pdf), Pensacola, FL, US.
U.S. Appl. No. 14/197,814, filed Mar. 5, 2014, Kaller, et al.
U.S. Appl. No. 14/210,537, filed Mar. 14, 2014, Abdollahzadeh Milani, et al.
U.S. Appl. No. 14/210,589, filed Mar. 14, 2014, Abdollahzadeh Milani, et al.
Lane, et al., "Voice Level: Autophonic Scale, Perceived Loudness, and the Effects of Sidetone", The Journal of the Acoustical Society of America, Feb. 1961, pp. 160-167, vol. 33, No. 2., Cambridge, MA, US.
Liu, et al., "Compensatory Responses to Loudness-shifted Voice Feedback During Production of Mandarin Speech", Journal of the Acoustical Society of America, Oct. 2007, pp. 2405-2412, vol. 122, No. 4.
Paepcke, et al., "Yelling in the Hall: Using Sidetone to Address a Problem with Mobile Remote Presence Systems", Symposium on User Interface Software and Technology, Oct. 16-19, 2011, 10 pages (pp. 1-10 in pdf), Santa Barbara, CA, US.
Therrien, et al., "Sensory Attenuation of Self-Produced Feedback: The Lombard Effect Revisited", Plos One, Nov. 2012, pp. 1-7, vol. 7, Issue 11, e49370, Ontario, Canada.
U.S. Appl. No. 14/228,322, filed Mar. 28, 2014, Alderson, et al.
U.S. Appl. No. 13/762,504, filed Feb. 8, 2013, Abdollahzadeh Milani, et al.
U.S. Appl. No. 13/721,832, filed Dec. 20, 2012, Lu, et al.
U.S. Appl. No. 13/724,656, filed Dec. 21, 2012, Lu, et al.
U.S. Appl. No. 14/252,235, filed Apr. 14, 2014, Lu, et al.
U.S. Appl. No. 13/968,013, filed Aug. 15, 2013, Abdollahzadeh Milani, et al.
U.S. Appl. No. 13/924,935, filed Jun. 24, 2013, Hellman.
U.S. Appl. No. 13/896,526, filed May 17, 2013, Naderi.
U.S. Appl. No. 14/101,955, filed Dec. 10, 2013, Alderson.
U.S. Appl. No. 14/101,777, filed Dec. 10, 2013, Alderson et al.
Abdollahzadeh Milani, et al., "On Maximum Achievable Noise Reduction in ANC Systems",2010 IEEE International Conference on Acoustics Speech and Signal Processing, Mar. 14-19, 2010, pp. 349-352, Dallas, TX, US.
Cohen, Israel, "Noise Spectrum Estimation in Adverse Environments: Improved Minima Controlled Recursive Averaging", IEEE Transactions on Speech and Audio Processing, Sep. 2003, pp. 1-11, vol. 11, Issue 5, Piscataway, NJ, US.
Ryan, et al., "Optimum Near-Field Performance of Microphone Arrays Subject to a Far-Field Beampattern Constraint", J. Acoust. Soc. Am., Nov. 2000, pp. 2248-2255, 108 (5), Pt. 1, Ottawa, Ontario, Canada.
Cohen, et al., "Noise Estimation by Minima Controlled Recursive Averaging for Robust Speech Enhancement", IEEE Signal Processing Letters, Jan. 2002, pp. 12-15, vol. 9, No. 1, Piscataway, NJ, US.
Martin, Rainer, "Noise Power Spectral Density Estimation Based on Optimal Smoothing and Minimum Statistics", IEEE Transactions on Speech and Audio Processing, Jul. 2001, pp. 504-512, vol. 9, No. 5, Piscataway, NJ, US.
Martin, Rainer, "Spectral Subtraction Based on Minimum Statistics", Signal Processing VII Theories and Applications, Proceedings of EUSIPCO-94, 7th European Signal Processing Conference, Sep. 13-16, 1994, pp. 1182-1185, vol. III, Edinburgh, Scotland, U.K.
Booij, et al., "Virtual sensors for local, three dimensional, broadband multiple-channel active noise control and the effects on the quiet zones", Proceedings of the International Conference on Noise and Vibration Engineering, ISMA 2010, Sep. 20-22, 2010, pp. 151-166, Leuven.
Kuo, et al., "Residual noise shaping technique for active noise control systems", J. Acoust. Soc. Am. 95(3), Mar. 1994, pp. 1665-1668.
Lopez-Caudana, Edgar Omar, "Active Noise Cancellation: The Unwanted Signal and the Hybrid Solution", Adaptive Filtering Applications, Dr. Lino Garcia (Ed.), Jul. 2011, pp. 49-84, ISBN: 978-953-307-306-4, InTech.
Senderowicz, et al., "Low-Voltage Double-Sampled Delta-Sigma Converters", IEEE Journal on Solid-State Circuits, Dec. 1997, pp. 1907-1919, vol. 32, No. 12, Piscataway, NJ.
Hurst, et al., "An improved double sampling scheme for switched-capacitor delta-sigma modulators", 1992 IEEE Int. Symp. on Circuits and Systems, May 10-13, 1992, vol. 3, pp. 1179-1182, San Diego, CA.
U.S. Appl. No. 13/686,353, filed Nov. 27, 2012, Hendrix, et al.
U.S. Appl. No. 13/795,160, filed Mar. 12, 2013, Hendrix, et al.
U.S. Appl. No. 13/692,367, filed Dec. 3, 2012, Alderson, et al.
U.S. Appl. No. 13/722,119, filed Dec. 20, 2012, Hendrix, et al.
U.S. Appl. No. 13/727,718, filed Dec. 27, 2012, Alderson, et al.
U.S. Appl. No. 13/784,018, filed Mar. 4, 2013, Alderson, et al.
U.S. Appl. No. 13/787,906, filed Mar. 7, 2013, Alderson, et al.
U.S. Appl. No. 13/794,931, filed Mar. 12, 2013, Lu, et al.
U.S. Appl. No. 13/794,979, filed Mar. 12, 2013, Alderson, et al.
Pfann, et al., "LMS Adaptive Filtering with Delta-Sigma Modulated Input Signals," IEEE Signal Processing Letters, Apr. 1998, pp. 95-97, vol. 5, No. 4, IEEE Press, Piscataway, NJ.
Toochinda, et al. "A Single-Input Two-Output Feedback Formulation for ANC Problems," Proceedings of the 2001 American Control Conference, Jun. 2001, pp. 923-928, vol. 2, Arlington, VA.
Kuo, et al., "Active Noise Control: A Tutorial Review," Proceedings of the IEEE, Jun. 1999, pp. 943-973, vol. 87, No. 6, IEEE Press, Piscataway, NJ.
Johns, et al., "Continuous-Time LMS Adaptive Recursive Filters," IEEE Transactions on Circuits and Systems, Jul. 1991, pp. 769-778, vol. 38, No. 7, IEEE Press, Piscataway, NJ.
Shoval, et al., "Comparison of DC Offset Effects in Four LMS Adaptive Algorithms," IEEE Transactions on Circuits and Systems II: Analog and Digital Processing, Mar. 1995, pp. 176-185, vol. 42, Issue 3, IEEE Press, Piscataway, NJ.
Mali, Dilip, "Comparison of DC Offset Effects on LMS Algorithm and its Derivatives," International Journal of Recent Trends in Engineering, May 2009, pp. 323-328, vol. 1, No. 1, Academy Publisher.
Kates, James M., "Principles of Digital Dynamic Range Compression," Trends in Amplification, Spring 2005, pp. 45-76, vol. 9, No. 2, Sage Publications.
Gao, et al., "Adaptive Linearization of a Loudspeaker," IEEE International Conference on Acoustics, Speech, and Signal Processing, Apr. 14-17, 1991, pp. 3589-3592, Toronto, Ontario, CA.
Silva, et al., "Convex Combination of Adaptive Filters With Different Tracking Capabilities," IEEE International Conference on Acoustics, Speech, and Signal Processing, Apr. 15-20, 2007, pp. III 925-928, vol. 3, Honolulu, HI, USA.
Akhtar, et al., "A Method for Online Secondary Path Modeling in Active Noise Control Systems," IEEE International Symposium on Circuits and Systems, May 23-26, 2005, pp. 264-267, vol. 1, Kobe, Japan.
Davari, et al., "A New Online Secondary Path Modeling Method for Feedforward Active Noise Control Systems," IEEE International Conference on Industrial Technology, Apr. 21-24, 2008, pp. 1-6, Chengdu, China.
Lan, et al., "An Active Noise Control System Using Online Secondary Path Modeling With Reduced Auxiliary Noise," IEEE Signal Processing Letters, Jan. 2002, pp. 16-18, vol. 9, Issue 1, IEEE Press, Piscataway, NJ.
Liu, et al., "Analysis of Online Secondary Path Modeling With Auxiliary Noise Scaled by Residual Noise Signal," IEEE Transactions on Audio, Speech and Language Processing, Nov. 2010, pp. 1978-1993, vol. 18, Issue 8, IEEE Press, Piscataway, NJ.
U.S. Appl. No. 13/968,007, filed Aug. 15, 2013, Hendrix, et al.

(56) References Cited

OTHER PUBLICATIONS

Parkins, et al., "Narrowband and broadband active control in an enclosure using the acoustic energy density", J. Acoust. Soc. Am. Jul. 2000, pp. 192-203, vol. 108, issue 1, US.
Feng, et al.., "A broadband self-tuning active noise equaliser", Signal Processing, Oct. 1, 1997, pp. 251-256, vol. 62, No. 2, Elsevier Science Publishers B.V. Amsterdam, NL.
Zhang, et al., "A Robust Online Secondary Path Modeling Method with Auxiliary Noise Power Scheduling Strategy and Norm Constraint Manipulation", IEEE Transactions on Speech and Audio Processing, IEEE Service Center, Jan. 1, 2003, pp. 45-53, vol. 11, No. 1, NY.
Lopez-Gaudana, et al., "A hybrid active noise cancelling with secondary path modeling", 51st Midwest Symposium on Circuits and Systems, MWSCAS 2008, Aug. 10-13, 2008, pp. 277-280, IEEE, Knoxville, TN.
International Search Report and Written Opinion in PCT/US2013/037942, mailed on Jul. 17, 2013, 10 pages (pp. 1-10 in pdf).
International Preliminary Report on Patentability in PCT/US2013/037942, mailed on Jun. 2, 2014, 19 pages (pp. 1-19 in pdf).
Campbell, Mikey, "Apple looking into self-adjusting earbud headphones with noise cancellation tech", Apple Insider, Jul. 4, 2013, pp. 1-10 (10 pages in pdf), downloaded on May 14, 2014 from http://appleinsider.com/articles/13/07/04/apple-looking-into-self-adjusting-earbud-headphones-with-noise-cancellation-tech.
Jin, et al. "A simultaneous equation method-based online secondary path modeling algorithm for active noise control", Journal of Sound and Vibration, Apr. 25, 2007, pp. 455-474, vol. 303, No. 3-5, London, GB.
Erkelens, et al., "Tracking of Nonstationary Noise Based on Data-Driven Recursive Noise Power Estimation", IEEE Transactions on Audio Speech and Language Processing, Aug. 2008, pp. 1112-1123, vol. 16, No. 6, Piscataway, NJ, US.
Rao, et al., "A Novel Two State Single Channel Speech Enhancement Technique", India Conference (INDICON) 2011 Annual IEEE, IEEE, Dec. 2011, 6 pages (pp. 1-6 in pdf), Piscataway, NJ, US.
Rangachari, et al., "A noise-estimation algorithm for highly non-stationary environments", Speech Communication, Feb. 2006, pp. 220-231, vol. 48, No. 2. Elsevier Science Publishers.
U.S. Appl. No. 14/578,567, filed Dec. 22, 2014, Kwatra, et al.
Widrow, B., et al., Adaptive Noise Cancelling; Principles and Applications, Proceedings of the IEEE, Dec. 1975, pp. 1692-1716, vol. 63, No. 13, IEEE, New York, NY, US.
Morgan, et al., A Delayless Subband Adaptive Filter Architecture, IEEE Transactions on Signal Processing, IEEE Service Center, Aug. 1995, pp. 1819-1829, vol. 43, No. 8, New York, NY, US.
U.S. Appl. No. 14/029,159, filed Sep. 17, 2013, Li, et al.
U.S. Appl. No. 14/062,951, filed Oct. 25, 2013, Zhou, et al.
U.S. Appl. No. 14/656,124, filed Mar. 12, 2015, Hendrix, et al.
U.S. Appl. No. 14/734,321, filed Jun. 9, 2015, Alderson, et al.
U.S. Appl. No. 14/840,831, Aug. 31, 2015, Hendrix, et al.
Rafaely, Boaz, "Active Noise Reducing Headset—an Overview", The 2001 International Congress and Exhibition on Noice Control Engineering, Aug. 27-30, 2001, 10 pages (pp. 1-10 in pdf), The Netherlands.
Ray, et al., "Hybrid Feedforward-Feedback Active Noise Reduction for Hearing Protection and Communication", The Journal of the Acoustical Society of America, American Institute of Physics for the Acoustical Society of America, Jan. 2006, pp. 2026-2036, vol. 120, No. 4, New York, NY.

* cited by examiner

DOWNLINK TONE DETECTION AND ADAPTATION OF A SECONDARY PATH RESPONSE MODEL IN AN ADAPTIVE NOISE CANCELING SYSTEM

This U.S. patent application claims priority under 35 U.S.C. §119(e) to U.S. Provisional Patent Application Ser. No. 61/701,187 filed on Sep. 14, 2012 and to U.S. Provisional Patent Application Ser. No. 61/645,333 filed on May 10, 2012.

BACKGROUND OF THE INVENTION

1. Field of the Invention

The present invention relates generally to personal audio devices such as wireless telephones that include adaptive noise cancellation (ANC), and more specifically, to control of adaptation of ANC adaptive responses in a personal audio device when tones, such as downlink ringtones, are present in the source audio signal.

2. Background of the Invention

Wireless telephones, such as mobile/cellular telephones, cordless telephones, and other consumer audio devices, such as mp3 players, are in widespread use. Performance of such devices with respect to intelligibility can be improved by providing noise canceling using a microphone to measure ambient acoustic events and then using signal processing to insert an anti-noise signal into the output of the device to cancel the ambient acoustic events.

Noise canceling operation can be improved by measuring the transducer output of a device at the transducer to determine the effectiveness of the noise canceling using an error microphone. The measured output of the transducer is ideally the source audio, e.g., downlink audio in a telephone and/or playback audio in either a dedicated audio player or a telephone, since the noise canceling signal(s) are ideally canceled by the ambient noise at the location of the transducer. To remove the source audio from the error microphone signal, the secondary path from the transducer through the error microphone can be estimated and used to filter the source audio to the correct phase and amplitude for subtraction from the error microphone signal. However, when tones such as remote ringtones are present in the downlink audio signal, the secondary path adaptive filter will attempt to adapt to the tone, rather than maintaining a broadband characteristic that will model the secondary path properly when downlink speech is present.

Therefore, it would be desirable to provide a personal audio device, including wireless telephones, that provides noise cancellation using a secondary path estimate to measure the output of the transducer and an adaptive filter that generates the anti-noise signal, in which improper operation due to tones in the downlink audio can be avoided, and in which tones can be reliably detected in the downlink audio signal.

SUMMARY OF THE INVENTION

The above stated objective of providing a personal audio device providing noise cancelling including a secondary path estimate that avoids improper operation due to tones in the downlink audio, is accomplished in a personal audio device, a method of operation, and an integrated circuit.

The personal audio device includes a housing, with a transducer mounted on the housing for reproducing an audio signal that includes both source audio for providing to a listener and an anti-noise signal for countering the effects of ambient audio sounds in an acoustic output of the transducer. A reference microphone is mounted on the housing to provide a reference microphone signal indicative of the ambient audio sounds. The personal audio device further includes an adaptive noise-canceling (ANC) processing circuit within the housing for adaptively generating an anti-noise signal from the reference microphone signal such that the anti-noise signal causes substantial cancellation of the ambient audio sounds. An error microphone is included for controlling the adaptation of the anti-noise signal to cancel the ambient audio sounds and for compensating for the electro-acoustical path from the output of the processing circuit through the transducer. The ANC processing circuit detects tones in the source audio and takes action on the adaptation of a secondary path adaptive filter that estimates the response of the secondary path and another adaptive filter that generates the anti-noise signal so that the overall ANC operation remains stable when the tones occur.

In another feature, a tone detector of the ANC processing circuit has adaptable parameters that provide for continued prevention of improper operation after tones occur in the source audio by waiting until non-tone source audio is present after the tones and then sequencing adaptation of the secondary path adaptive filter and then the other adaptive filter that generates the anti-noise signal.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

Noise canceling techniques and circuits that can be implemented in a personal audio device, such as a wireless telephone, are disclosed. The personal audio device includes an adaptive noise canceling (ANC) circuit that measures the ambient acoustic environment and generates a signal that is injected into the speaker (or other transducer) output to cancel ambient acoustic events. A reference microphone is provided to measure the ambient acoustic environment, and an error microphone is included to measure the ambient audio and transducer output at the transducer, thus giving an indication of the effectiveness of the noise cancelation. A secondary path estimating adaptive filter is used to remove the playback audio from the error microphone signal, in order to generate an error signal. However, tones in the source audio reproduced by the personal audio device, e.g., ringtones present in the downlink audio during initiation of a telephone conversation or other tones in the background of a telephone conversation, will cause improper adaptation of the secondary path adaptive filter. Further, after the tones have ended, during recovery from an improperly adapted state, unless the secondary path estimating adaptive filter has the proper response, the remainder of the ANC system may not adapt properly, or may become unstable. The exemplary personal audio devices, method and circuits shown below sequence adaptation of the secondary path estimating adaptive filter and the remainder of the ANC system to avoid instabilities and to adapt the ANC system to the proper response. Further, the magnitude of the leakage of the source audio into the reference microphone can be measured or estimated, and action taken on the adaptation of the ANC system and recovery from such a condition after the source audio has ended or decreased in volume such that stable operation can be expected.

Figure 1:
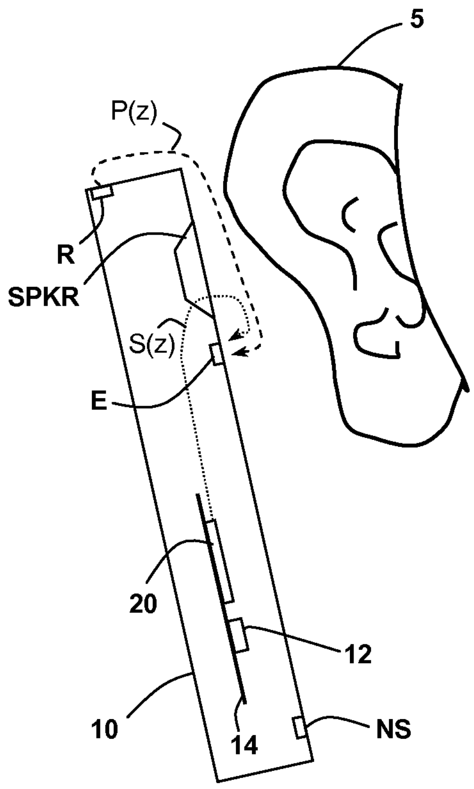
FIG. 1 is an illustration of an exemplary wireless telephone 10.

FIG. 1 shows an exemplary wireless telephone 10 in proximity to a human ear 5. Illustrated wireless telephone 10 is an example of a device in which techniques illustrated herein may be employed, but it is understood that not all of the elements or configurations embodied in illustrated wireless telephone 10, or in the circuits depicted in subsequent illustrations, are required. Wireless telephone 10 includes a transducer such as speaker SPKR that reproduces distant speech received by wireless telephone 10, along with other local audio events such as ringtones, stored audio program material, near-end speech, sources from web-pages or other network communications received by wireless telephone 10 and audio indications such as battery low and other system event notifications. A near-speech microphone NS is provided to capture near-end speech, which is transmitted from wireless telephone 10 to the other conversation participant(s).

Wireless telephone 10 includes adaptive noise canceling (ANC) circuits and features that inject an anti-noise signal into speaker SPKR to improve intelligibility of the distant speech and other audio reproduced by speaker SPKR. A reference microphone R is provided for measuring the ambient acoustic environment and is positioned away from the typical position of a user/talker's mouth, so that the near-end speech is minimized in the signal produced by reference microphone R. A third microphone, error microphone E, is provided in order to further improve the ANC operation by providing a measure of the ambient audio combined with the audio signal reproduced by speaker SPKR close to ear 5, when wireless telephone 10 is in close proximity to ear 5. Exemplary circuit 14 within wireless telephone 10 includes an audio CODEC integrated circuit 20 that receives the signals from reference microphone R, near speech microphone NS, and error microphone E and interfaces with other integrated circuits such as an RF integrated circuit 12 containing the wireless telephone transceiver. In other embodiments of the invention, the circuits and techniques disclosed herein may be incorporated in a single integrated circuit that contains control circuits and other functionality for implementing the entirety of the personal audio device, such as an MP3 player-on-a-chip integrated circuit.

In general, the ANC techniques disclosed herein measure ambient acoustic events (as opposed to the output of speaker SPKR and/or the near-end speech) impinging on reference microphone R, and by also measuring the same ambient acoustic events impinging on error microphone E, the ANC processing circuits of illustrated wireless telephone 10 adapt an anti-noise signal generated from the output of reference microphone R to have a characteristic that minimizes the amplitude of the ambient acoustic events present at error microphone E. Since acoustic path P(z) extends from reference microphone R to error microphone E, the ANC circuits are essentially estimating acoustic path P(z) combined with removing effects of an electro-acoustic path S(z). Electro-acoustic path S(z) represents the response of the audio output circuits of CODEC IC 20 and the acoustic/electric transfer function of speaker SPKR including the coupling between speaker SPKR and error microphone E in the particular acoustic environment. Electro-acoustic path S(z) is affected by the proximity and structure of ear 5 and other physical objects and human head structures that may be in proximity to wireless telephone 10, when wireless telephone 10 is not firmly pressed to ear 5. While the illustrated wireless telephone 10 includes a two microphone ANC system with a third near speech microphone NS, other systems that do not include separate error and reference microphones can implement the above-described techniques. Alternatively, near speech microphone NS can be used to perform the function of the reference microphone R in the above-described system. Finally, in personal audio devices designed only for audio playback, near speech microphone NS will generally not be included, and the near-speech signal paths in the circuits described in further detail below can be omitted.

Figure 2:
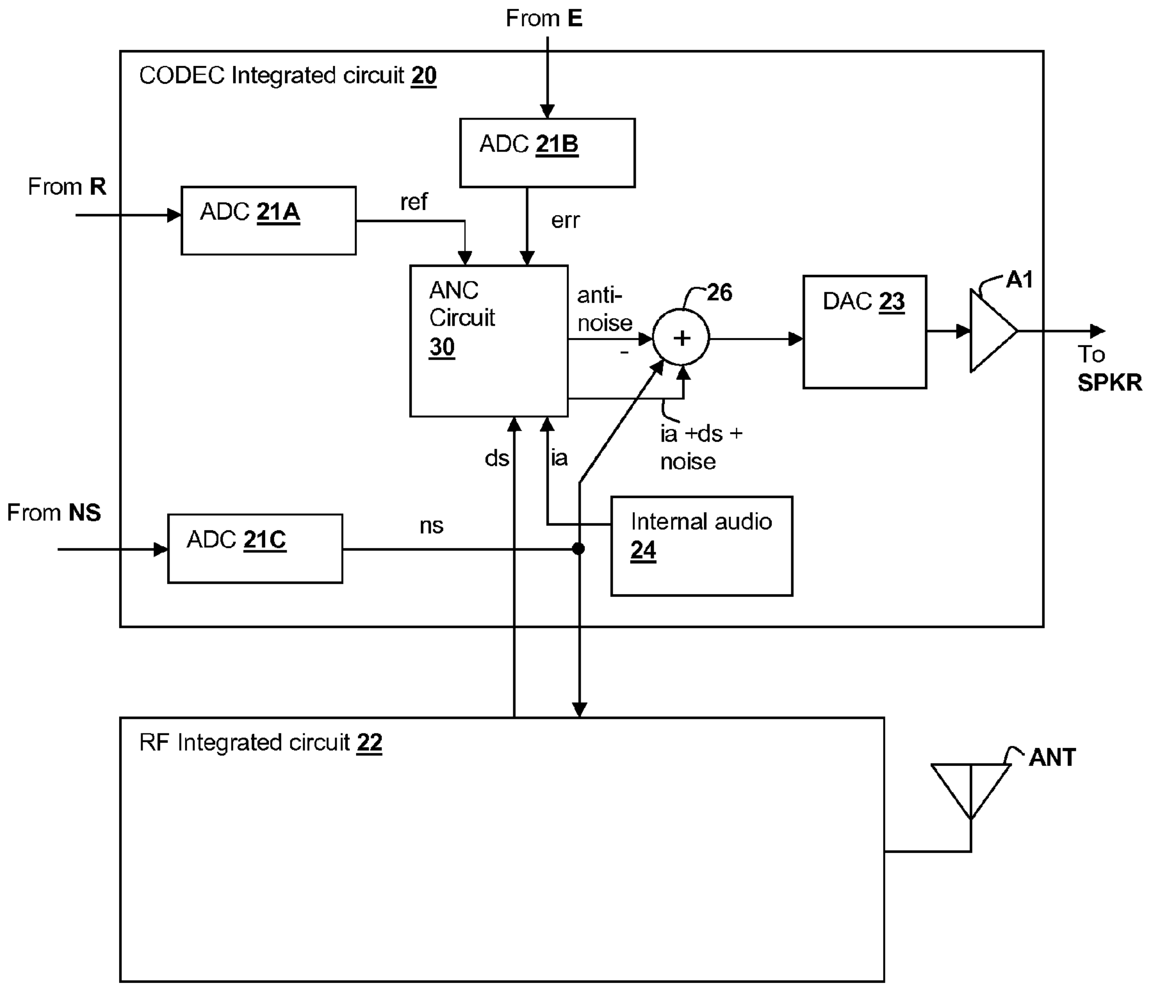
FIG. 2 is a block diagram of circuits within wireless telephone 10.

Referring now to FIG. 2, circuits within wireless telephone 10 are shown in a block diagram. CODEC integrated circuit 20 includes an analog-to-digital converter (ADC) 21A for receiving the reference microphone signal and generating a digital representation ref of the reference microphone signal, an ADC 21B for receiving the error microphone signal and generating a digital representation err of the error microphone signal, and an ADC 21C for receiving the near speech microphone signal and generating a digital representation of near speech microphone signal ns. CODEC IC 20 generates an output for driving speaker SPKR from an amplifier A1, which amplifies the output of a digital-to-analog converter (DAC) 23 that receives the output of a combiner 26. Combiner 26 combines audio signals ia from internal audio sources 24, the anti-noise signal anti-noise generated by ANC circuit 30, which by convention has the same polarity as the noise in reference microphone signal ref and is therefore subtracted by combiner 26, a portion of near speech signal ns so that the user of wireless telephone 10 hears their own voice in proper relation to downlink speech ds, which is received from radio frequency (RF) integrated circuit 22. In accordance with an embodiment of the present invention, downlink speech ds is provided to ANC circuit 30. The downlink speech ds and internal audio ia are provided to combiner 26, so that signal (ds+ia) may be presented to estimate acoustic path S(z) with a secondary path adaptive filter within ANC circuit 30. Near speech signal ns is also provided to RF integrated circuit 22 and is transmitted as uplink speech to the service provider via antenna ANT.

Figure 3:
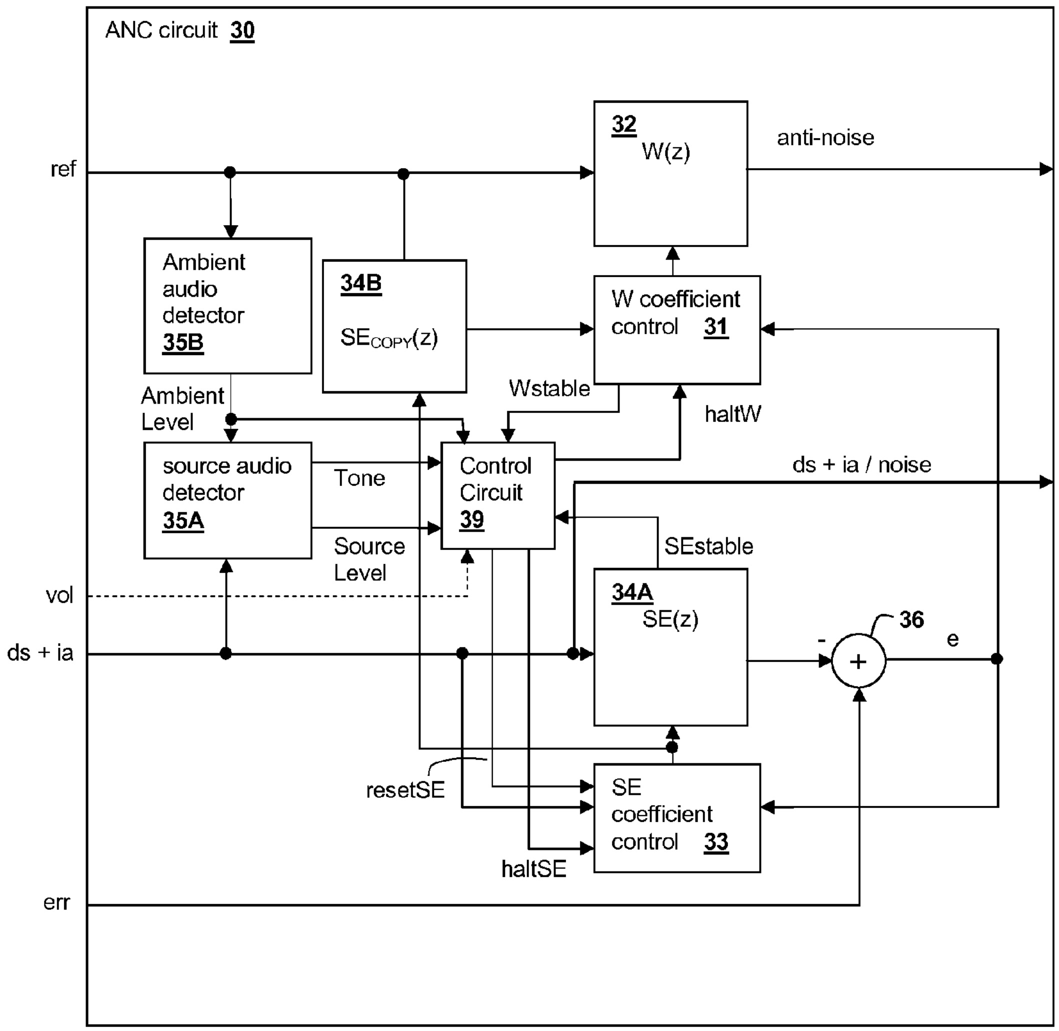
FIG. 3 is a block diagram depicting an example of signal processing circuits and functional blocks that may be included within ANC circuit 30 of CODEC integrated circuit 20 of FIG. 2.

FIG. 3 shows one example of details of ANC circuit 30 of FIG. 2. An adaptive filter 32 receives reference microphone signal ref and under ideal circumstances, adapts its transfer function W(z) to be P(z)/S(z) to generate the anti-noise signal anti-noise, which is provided to an output combiner that combines the anti-noise signal with the audio signal to be reproduced by the transducer, as exemplified by combiner 26 of FIG. 2. The coefficients of adaptive filter 32 are controlled by a W coefficient control block 31 that uses a correlation of two signals to determine the response of adaptive filter 32, which generally minimizes the error, in a least-mean squares sense, between those components of reference microphone signal ref present in error microphone signal err. The signals processed by W coefficient control block 31 are the reference microphone signal ref as shaped by a copy of an estimate of the response of path S(z) provided by filter 34B and another signal that includes error microphone signal err. By transforming reference microphone signal ref with a copy of the estimate of the response of path S(z), response $SE_{COPY}(z)$, and minimizing error microphone signal err after removing components of error microphone signal err due to playback of source audio, adaptive filter 32 adapts to the desired response of P(z)/S(z). In addition to error microphone signal err, the other signal processed along with the output of filter 34B by W coefficient control block 31 includes an inverted amount of the source audio including downlink audio signal ds and internal audio ia that has been processed by filter response SE(z), of which response $SE_{COPY}(z)$ is a copy. By injecting an inverted amount of source audio, adaptive filter 32 is prevented from adapting to the relatively large amount of source audio present in error microphone signal err and by transforming the inverted copy of downlink audio signal ds and internal audio ia with the estimate of the response of path S(z), the source audio that is removed from error microphone signal err before processing should match the expected version of downlink audio signal ds, and internal audio ia reproduced at error microphone signal err, since the electrical and acoustical path of S(z) is the path taken by downlink audio signal ds and internal audio ia to arrive at error microphone E. Filter 34B is not an adaptive filter, per se, but has an adjustable response that is tuned to match the response of adaptive filter 34A, so that the response of filter 34B tracks the adapting of adaptive filter 34A.

To implement the above, adaptive filter 34A has coefficients controlled by SE coefficient control block 33, which processes the source audio (ds+ia) and error microphone signal err after removal, by a combiner 36, of the above-described filtered downlink audio signal ds and internal audio ia, that has been filtered by adaptive filter 34A to represent the expected source audio delivered to error microphone E. Adaptive filter 34A is thereby adapted to generate an error signal e from downlink audio signal ds and internal audio ia, that when subtracted from error microphone signal err, contains the content of error microphone signal err that is not due to source audio (ds+ia). However, if downlink audio signal ds and internal audio ia are both absent, e.g., at the beginning of a telephone call, or have very low amplitude, SE coefficient control block 33 will not have sufficient input to estimate acoustic path S(z). Therefore, in ANC circuit 30, a source audio detector 35A detects whether sufficient source audio (ds+ia) is present, and updates the secondary path estimate if sufficient source audio (ds+ia) is present. Source audio detector 35A may be replaced by a speech presence signal if a speech presence signal is available from a digital source of the downlink audio signal ds, or a playback active signal provided from media playback control circuits.

Control circuit 39 receives inputs from source audio detector 35A, which include a Tone indicator that indicates when a dominant tone signal is present in downlink audio signal ds and a Source Level indication reflecting the detected level of the overall source audio (ds+ia). Control circuit 39 also receives an input from an ambient audio detector 35B that provides an indication of the detected level of reference microphone signal ref. Control circuit 39 may receive an indication vol of the volume setting of the personal audio device. Control circuit 39 also receives a stability indication Wstable from W coefficient control 31, which is generally de-asserted when a stability measure $\Sigma|W_k(z)|/\Delta t$, which is the rate of change of the sum of the coefficients of response W(z), is greater than a threshold, but alternatively, stability indication Wstable may be based on fewer than all of the coefficients of response W(z) that determine the response of adaptive filter 32. Further, control circuit 39 generates control signal haltW to control adaptation of W coefficient control 31 and generates control signal haltSE to control adaptation of SE coefficient control 33. Exemplary algorithms for sequencing of the adapting of response W(z) and secondary path estimate SE(z) are discussed in further detail below with reference to FIGS. 5-8.

Figure 4:
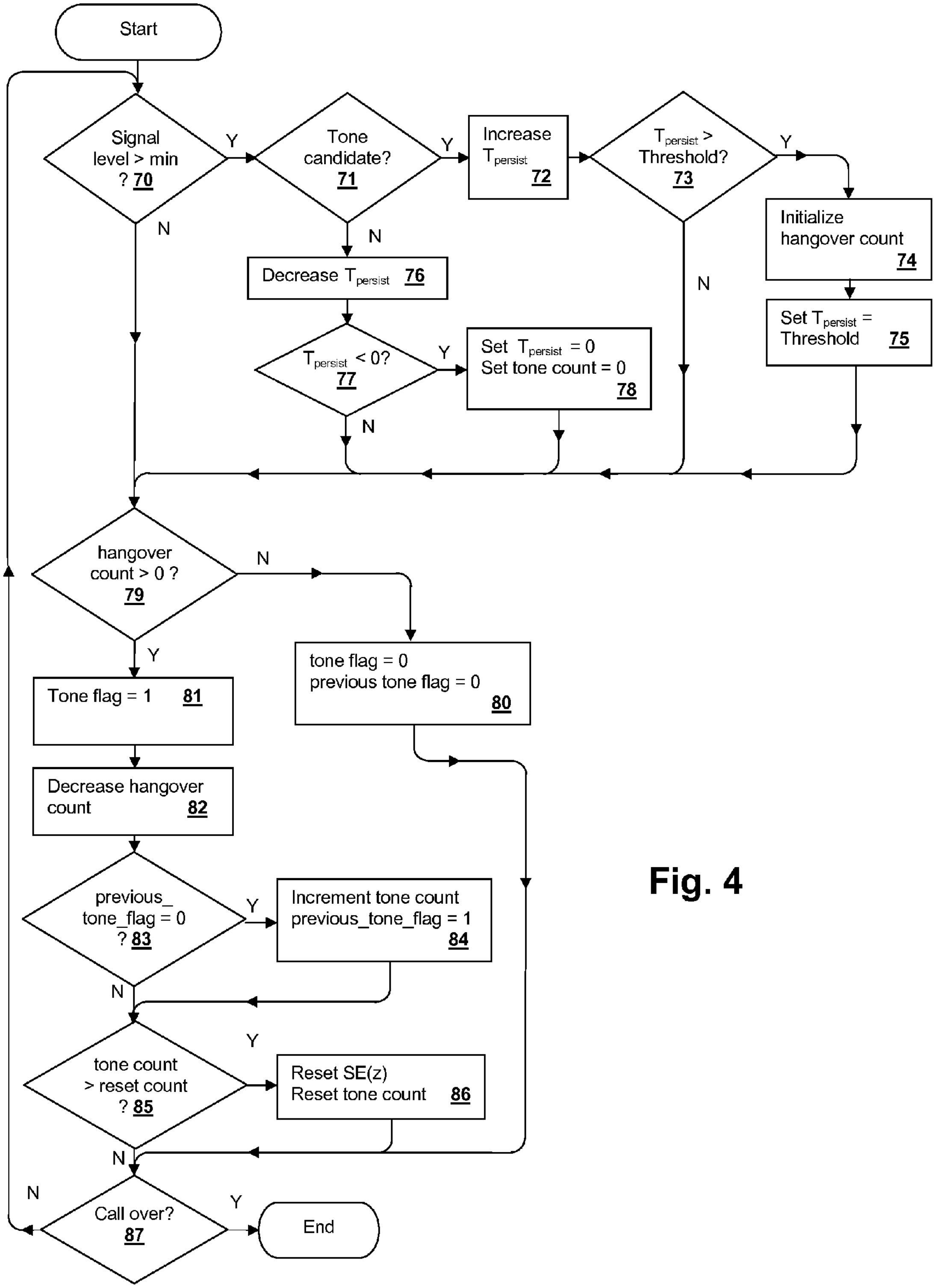
FIG. 4 is a flow chart depicting a tone detection algorithm that can be implemented by CODEC integrated circuit 20.
Figure 5:
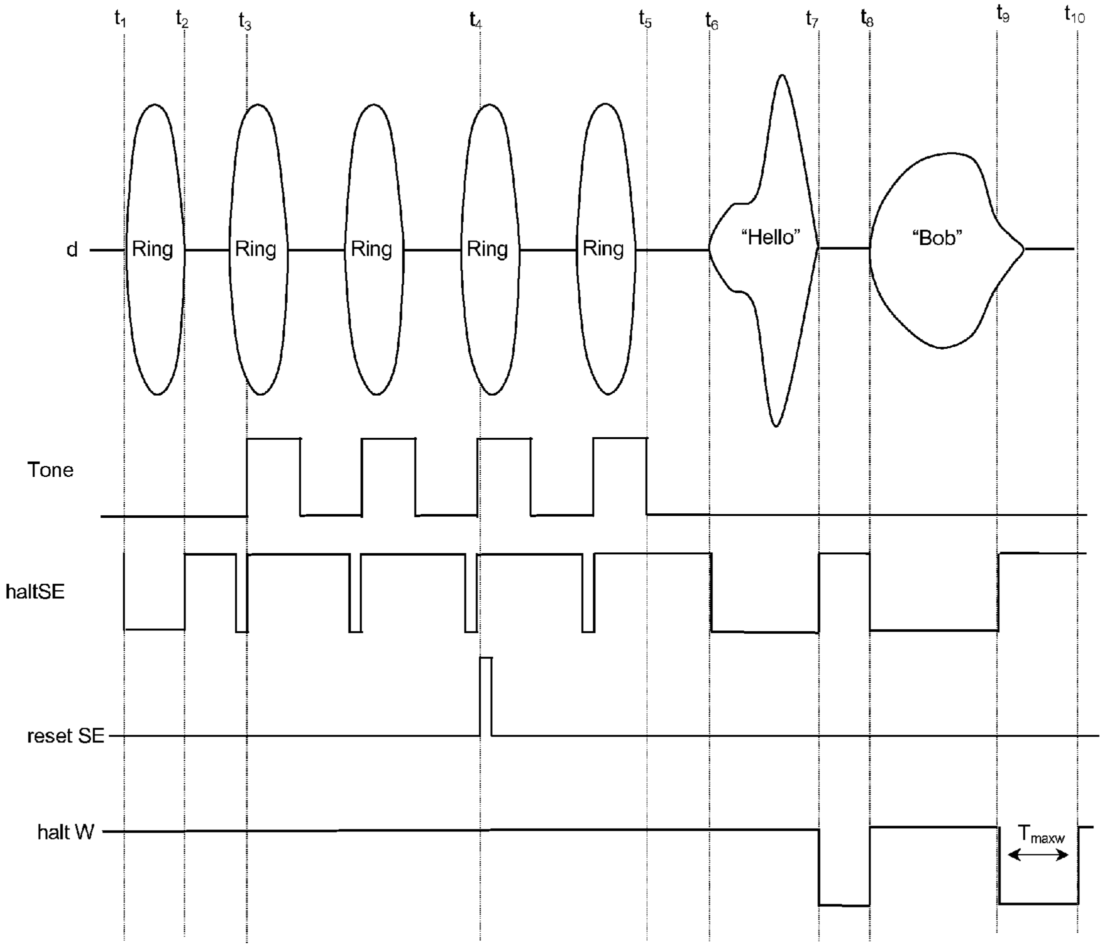
FIG. 5 is a signal waveform diagram illustrating operation of ANC circuit 30 of CODEC integrated circuit 20 of FIG. 2 in accordance with an implementation as illustrated in FIG. 4.

Within source audio detector 35A, a tone detection algorithm determines when a tone is present in source audio (ds+ia), an example of which is illustrated in FIG. 4. Referring now to FIG. 4, while the amplitude of source audio (ds+ia) is less than or equal to a minimum threshold value "min" (decision 70), processing proceeds to step 79. If the amplitude "Signal Level" of source audio (ds+ia) is greater than the minimum threshold value "min" (decision 70) and if the current audio is a tone candidate (decision 71), then persistence time $T_{persist}$ increased (step 72), and once persistence time $T_{persist}$ has reached a threshold value (decision 73), indicating that a tone has been detected, a hangover count is initialized to a non-zero value (step 74) and persistence time $T_{persist}$ is set to the threshold value to prevent the persistence time $T_{persist}$ from continuing to increase (step 75). If the current audio is not a tone candidate (decision 71), the persistence time $T_{persist}$ is decreased (step 76). Increasing and decreasing persistence time $T_{persist}$ only when sufficient signal level is present acts as a filter that implements a confidence criteria based on recent history, i.e., whether or not the most recent signal has been a tone, or other audio. Thus, persistence time is a tone detection confidence value that has sufficiently high value to avoid false tone detection for the particular implementation and device, while having a low enough value to avoid missing cumulative duration of one or more tones sufficient to substantially affect the adaptation of the ANC system, in particular improper adaptation of response SE(z) to the frequency of the tone(s). A tone candidate is detected in source audio (ds+ia) using a neighborhood amplitude comparison of a discrete-Fourier transform (DFT) of source audio (ds+ia) or another suitable multi-band filtering technique to distinguish broadband noise or signals from audio that is predominately a tone. If persistence time $T_{persist}$ becomes less than zero (decision 77), indicating that accumulated non-tone signal has been present for a substantial period, persistence time $T_{persist}$ is set to zero and a tone count, which is a count of a number of tones that have occurred recently, is also set to zero.

The processing algorithm then proceeds to decision 79 whether or not a tone has been detected, and if the hangover count is not greater than zero (decision 79), indicating that a tone has not yet been detected by decision 73, or that the hangover count has expired after a tone has been detected, the tone flag is reset indicating that no tone is present and a previous tone flag is also reset (step 80). The hangover count is a count that provides for maintaining the tone flag in a set condition (e.g., tone flag="1") after detection of a tone has ceased, in order to avoid resuming adaptation of the ANC system too early, e.g., when another tone is likely to occur and cause response SE(z) to adapt improperly. The value of the hangover count is implementation specific, but should be sufficient to avoid the above improper adaptation condition. Processing then repeats from step 70 if the telephone call is not ended at decision 87. However, it the hangover count is greater than zero (decision 79), then the tone flag is set (to a value of "1") (step 81) and the hangover count is decreased (step 82), causing the system to treat the current source audio as a tone while the hangover count is non-zero. If the previous tone flag is not set, (e.g., the tone flag has a value of "0") (decision 83), then the tone count is incremented and the previous tone flag is set (to a value of "1") (step 84). Otherwise, if the tone flag is set (result "No" at decision 83), then the processing algorithm proceeds directly to decision 85. Then, if the tone count exceeds a predetermined reset count (decision 85), which is the number of tones after which response SE(z) should be set to a known state, response SE(z) is reset and the tone count is also reset (step 86). Until the call is over (decision 87), the algorithm of steps 70-86 is repeated. Otherwise, the algorithm ends.

The exemplary circuits and methods illustrated herein provide proper operation of the ANC system by reducing the impact of remote tones on response SE(z) of secondary path adaptive filter 34A, which consequently reduces the impact of the tones on response $SE_{COPY}(z)$ of filter 34B and response W(z) of adaptive filter 32. In the example shown in FIG. 5, which illustrates exemplary operational waveforms of control circuit 39 of FIG. 3 with a tone detector using the algorithm illustrated in FIG. 4, control circuit 39 halts the adaptation of SE coefficient control 33 by asserting control signal haltSE when tones are detected in source audio (ds+ia) as indicated by tone flag Tone. The first tone occurring between time $t_1$ and time $t_2$ is not determined to be a tone due to the low initial persistence time $T_{persist}$, which prevents false detection of tones. Thus, control signal haltSE is not de-asserted until time $t_2$, which is due to the signal level decreasing below a threshold, indicating to control circuit 39 that there is insufficient signal level in source audio (d+ia) to adapt SE coefficient control 33. At time $t_3$, the second tone in the sequence has been detected, due to a longer persistence time $T_{persist}$, which has been increased according to the above-described tone detection algorithm. Therefore, control signal haltSE is asserted earlier during the second tone, which reduces the impact of the tone on the coefficients of SE coefficient control 33. At time $t_4$, control circuit 39 has determined that four tones (or some other selectable number) have occurred, and asserts control signal resetSE to reset SE coefficient control 33 to a known set of coefficients, thereby setting response SE(z) to a known response. At time $t_5$, the tones in the source audio have ended, but response W(z) is not allowed to adapt, since adaptation of response SE(z) must be performed with a more appropriate training signal to ensure that the tones have not disrupted response SE(z) during the interval from time $t_1$ to time $t_5$ and no source audio is present to adapt response SE(z) at time $t_5$. At time $t_6$, downlink speech is present, and control circuit 39 commences sequencing of the training of SE coefficient control 33 and then W coefficient control 31 so that SE coefficient control 33 contains proper values after tones are detected in the source audio, and thus response $SE_{COPY}(z)$ and response SE(z) have suitable characteristics prior to adapting response W(z). The above is accomplished by permitting W coefficient control 31 to adapt only after SE coefficient control 33 has adapted, which is performed once a non-tone source audio signal of sufficient amplitude is present, and then adaptation of SE coefficient control 33 is halted. In the example shown in FIG. 5, secondary path adaptive filter adaptation is halted by asserting control signal haltSE after the estimated response SE(z) has become stable and response W(z) is allowed to adapt by de-asserting control signal haltW. In the particular operation shown in FIG. 7, response SE(z) is only allowed to adapt when response W(z) is not adapting and vice-versa, although under other circumstances or in other operating modes, response SE(z) and response W(z) can be allowed to adapt at the same time. In the particular example, response SE(z) is adapting up until time $t_7$, when either the amount of time that response SE(z) has been adapting, the assertion of indication SEstable, or other criteria indicates that response SE(z) has adapted sufficiently to estimate secondary paths S(z) and W(z) can then be adapted.

At time $t_7$, control signal halt SE is asserted and control signal haltW is de-asserted, to transition from adapting SE(z) to adapting response W(z). At time $t_8$, source audio is again detected, and control signal haltW is asserted to halt the adaptation of response W(z). Control signal halt SE is then de-asserted, since a non-tone downlink audio signal is generally a good training signal for response SE(z). At time $t_9$, the level indication has decreased below the threshold and response W(z) is again permitted to adapt by de-asserting control signal haltW and adaptation of response SE(z) is halted by asserting control signal haltSE, which continues until time $t_{10}$, when response W(z) has been adapting for a maximum time period $T_{maxw}$.

Figure 6:
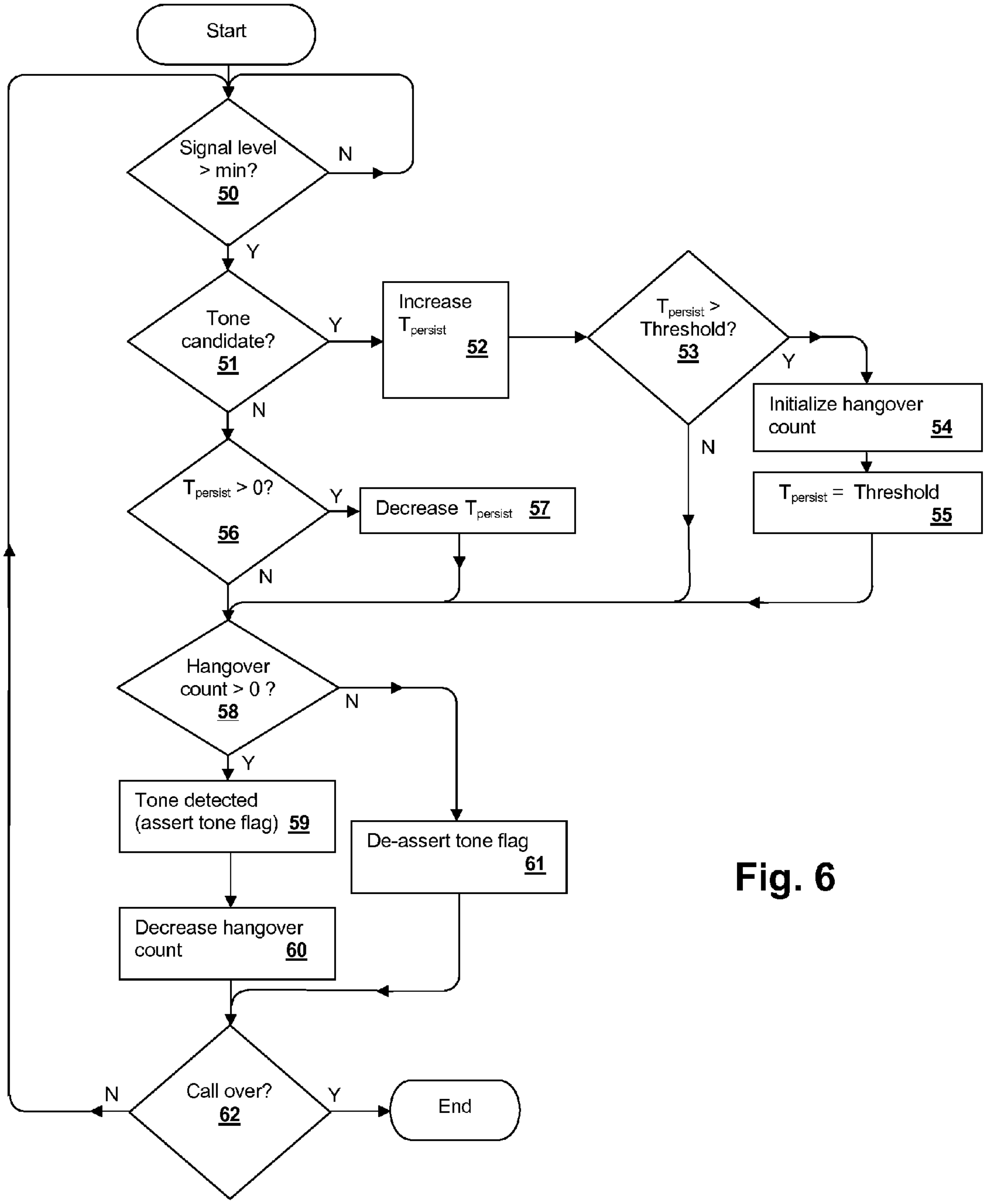
FIG. 6 is a flow chart depicting another tone detection algorithm that can be implemented by CODEC integrated circuit 20.

Within source audio detector 35A, another tone detection algorithm that determines when a tone is present in source audio (ds+ia), is illustrated in FIG. 6, which is similar to that of FIG. 4, so only some of the features of the algorithm of FIG. 6 will be described herein below. While the amplitude of source audio (ds+ia) is less than or equal to a minimum threshold value (decision 50), processing proceeds to decision 58. If the amplitude of source audio (ds+ia) is greater than the minimum threshold value (decision 50), and if the current audio is a tone candidate (decision 51), then the persistence time of the tone $T_{persist}$ is increased (step 52), and once the persistence time $T_{persist}$ has reached a threshold value (decision 53), indicating that a tone has been detected, a hangover count is initialized to a non-zero value (step 54) and persistence time $T_{persist}$ is set to the threshold value to prevent the persistence time $T_{persist}$ from continuing to increase (step 55). Otherwise, if persistence time $T_{persist}$ has not reached the threshold value (decision 53), processing proceeds through decision 58. If the current audio is not a tone candidate (decision 51), and while persistence time $T_{persist}>0$ (decision 56), the persistence time $T_{persist}$ is decreased (step 57). The processing algorithm proceeds to decision 58 whether or not a tone has been detected, and if the hangover count is not greater than zero (decision 58), indicating that a tone has not yet been detected by decision 53, or that the hangover count has expired after a tone has been detected, the tone flag is de-asserted (step 61) indicating that no tone is present. However, if the hangover count is greater than zero (decision 58) then the tone flag is asserted (step 59) and the hangover count is decreased (step 60). Until the call is over (decision 62), the algorithm of steps 50-61 is repeated, otherwise the algorithm ends.

Figure 7:
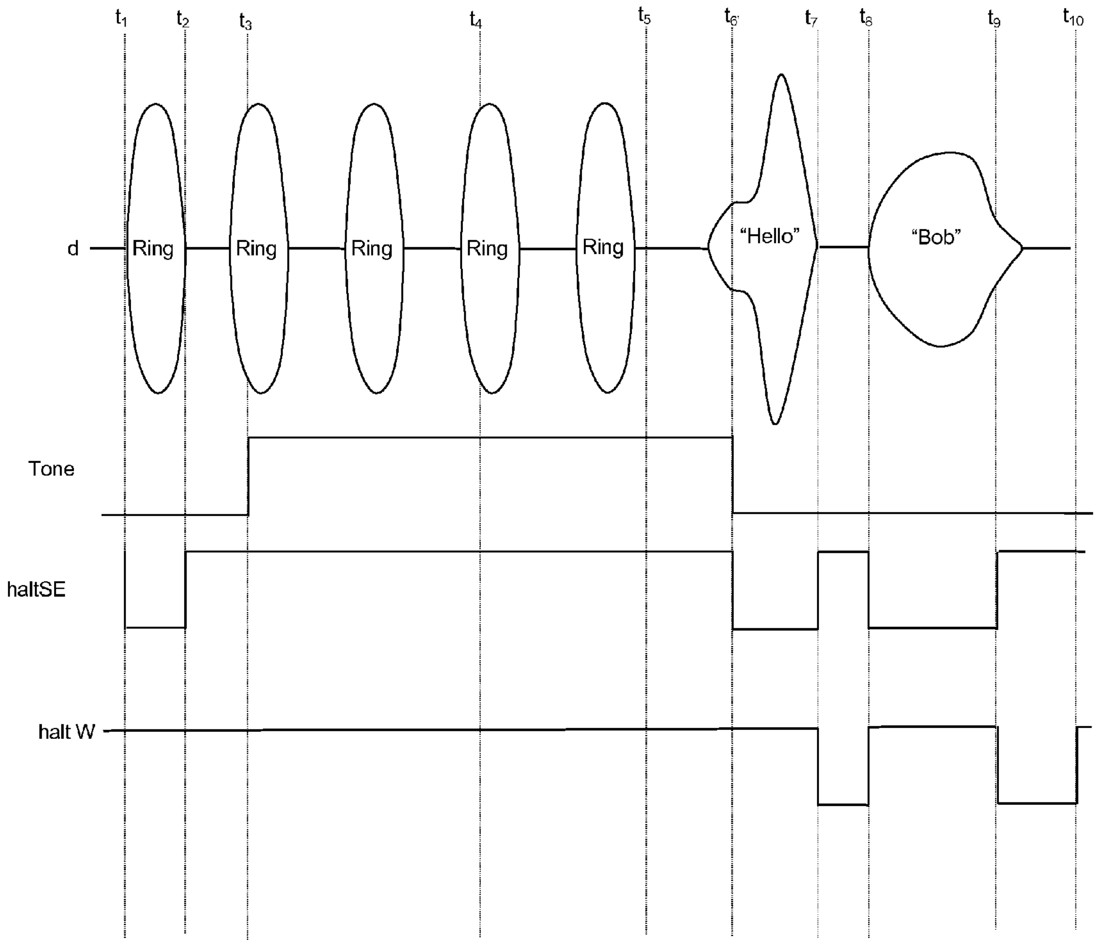
FIG. 7 is a signal waveform diagram illustrating operation of ANC circuit 30 of CODEC integrated circuit 20 of FIG. 2 in accordance with an implementation as illustrated in FIG. 6.

In the example shown in FIG. 7, which illustrates operation of control circuit 39 of FIG. 3 with a tone detector using the algorithm illustrated in FIG. 6, after the second ringtone is detected at time $t_3$ and due to the hangover count being initialized according to the above-described tone-detection algorithm as illustrated in FIG. 6, tone flag Tone is not de-asserted until the hangover count has reached zero at decision 57 in the algorithm of FIG. 6. The advantage of decreasing the hangover count only when the amplitude of source audio (d+ia) is below a threshold is apparent from the differences between the example of FIG. 5, in which the hangover count is decreased when there is no tone detected, and that of FIG. 7. In the example of FIG. 7, control signal haltSE is asserted from detection the second ringtone until after the last ringtone has ceased and the hangover count has expired, preventing SE coefficient control 33 from adapting during any tone after the first tone has ended, until the hangover count decreases to zero when non-tone source audio (d+ia) of sufficient amplitude is present. At time $t_6$', the hangover count expires and control signal haltSE is de-asserted causing response SE(z) to adapt. Although the tones in the source audio have ended, response W(z) is not allowed to adapt until adaptation of response SE(z) is performed with a more appropriate training signal to ensure that the tones have not disrupted response SE(z) during the interval from time $t_1$ to time $t_5$. At time $t_7$, control signal haltSE is asserted and control signal haltW is de-asserted to permit response W(z) to adapt.

Figure 8:
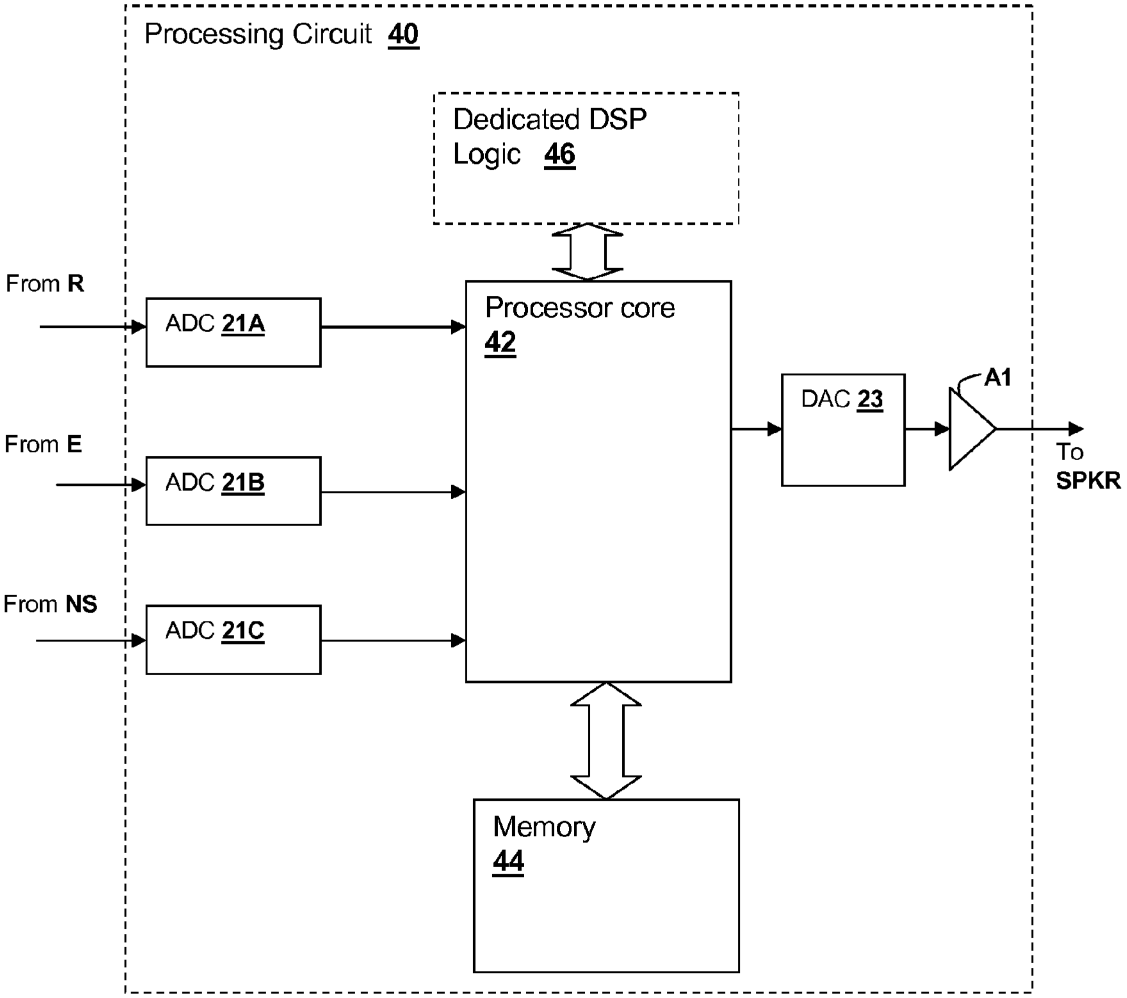
FIG. 8 is a block diagram depicting signal processing circuits and functional blocks within CODEC integrated circuit 20.

Referring now to FIG. 8, a block diagram of an ANC system is shown for implementing ANC techniques as depicted in FIG. 3, and having a processing circuit 40 as may be implemented within CODEC integrated circuit 20 of FIG. 2. Processing circuit 40 includes a processor core 42 coupled to a memory 44 in which are stored program instructions comprising a computer-program product that may implement some or all of the above-described ANC techniques, as well as other signal processing. Optionally, a dedicated digital signal processing (DSP) logic 46 may be provided to implement a portion of, or alternatively all of, the ANC signal processing provided by processing circuit 40. Processing circuit 40 also includes ADCs 21A-21C, for receiving inputs from reference microphone R, error microphone E and near speech microphone NS, respectively. DAC 23 and amplifier A1 are also provided by processing circuit 40 for providing the transducer output signal, including anti-noise as described above.

While the invention has been particularly shown and described with reference to the preferred embodiments thereof, it will be understood by those skilled in the art that the foregoing, as well as other changes in form and details may be made therein without departing from the spirit and scope of the invention.

What is claimed is:

1. A personal audio device, comprising:

a personal audio device housing;

a transducer mounted on the housing for reproducing an audio signal including both source audio for playback to a listener and an anti-noise signal for countering the effects of ambient audio sounds in an acoustic output of the transducer;

a reference microphone mounted on the housing for providing a reference microphone signal indicative of the ambient audio sounds;

an error microphone mounted on the housing in proximity to the transducer for providing an error microphone signal indicative of the acoustic output of the transducer and the ambient audio sounds at the transducer; and a processing circuit that generates the anti-noise signal from the reference microphone signal by adapting a first adaptive filter to reduce the presence of the ambient audio sounds heard by the listener in conformity with an error signal and the reference microphone signal, wherein the processing circuit implements a secondary path adaptive filter having a secondary path response that shapes the source audio and a combiner that removes the source audio from the error microphone signal to provide the error signal, wherein the processing circuit detects a frequency-dependent characteristic of the source audio that is independent of the ambient audio sounds using frequency selective filtering of the source audio and takes action to prevent improper generation of the anti-noise signal in response to detecting the characteristic of the source audio.

2. The personal audio device of claim 1, wherein the processing circuit halts adaptation of the secondary path adaptive filter in response to detecting that the source audio is predominantly a tone.

3. The personal audio device of claim 2, wherein the processing circuit further halts adaptation of the first adaptive filter in response to detecting that the source audio is predominantly a tone.

4. The personal audio device of claim 2, wherein the processing circuit, in response to detecting that the source audio no longer is predominantly a tone, sequences adaptation of the secondary path adaptive filter and the first adaptive filter so that adaptation of a first one of the first adaptive filter or the secondary path adaptive filter is initiated only after adaptation of another one of the first adaptive filter or the secondary path adaptive filter is substantially completed or halted.

5. The personal audio device of claim 4, wherein the processing circuit sequences adaptation of the secondary path adaptive filter and the first adaptive filter such that adaptation of the secondary path adaptive filter is performed prior to adaptation of the first adaptive filter and while adaptation of the first adaptive filter is halted.

6. The personal audio device of claim 2, wherein the processing circuit detects a tone in the source audio using a tone detector that has adaptive decision criteria for determining at least one of when the tone has been detected and when normal operation can be resumed after a non-tonal signal has been detected.

7. The personal audio device of claim 6, wherein the tone detector increments a persistence counter in response to determining that the tone is present, and wherein the tone detector determines that the tone has been detected when the persistence counter exceeds a threshold value.

8. The personal audio device of claim 7, wherein the tone detector, in response to determining that the tone has been detected, sets a hangover count to a predetermined value and decrements the hangover counter in response to subsequently determining that the tone is absent and only if source audio of sufficient audio is present, and wherein the tone detector indicates that normal operation can be resumed when the hangover count reaches zero.

9. The personal audio device of claim 2, wherein the processing circuit, in response to detecting a number of tones, resets adaptation of the secondary path adaptive filter, so that an amount of deviation of coefficients of the secondary path adaptive filter due to adapting to initial portions of the number of tones is reduced.

10. A method of countering effects of ambient audio sounds by a personal audio device, the method comprising:

adaptively generating an anti-noise signal from the reference microphone signal by adapting a first adaptive filter to reduce the presence of the ambient audio sounds heard by the listener in conformity with an error signal and a reference microphone signal;

combining the anti-noise signal with source audio;

providing a result of the combining to a transducer;

measuring the ambient audio sounds with a reference microphone;

measuring an acoustic output of the transducer and the ambient audio sounds with an error microphone;

implementing a secondary path adaptive filter having a secondary path response that shapes the source audio and a combiner that removes the source audio from the error microphone signal to provide the error signal;

detecting a frequency-dependent characteristic of the source audio that is independent of The ambient audio sounds using frequency-selective filtering of the source audio; and taking action to prevent improper generation of the anti-noise signal in response to detecting the characteristic of the source audio.

11. The method of claim 10, further comprising halting adaptation of the secondary path adaptive filter in response to detecting that the source audio is predominantly a tone.

12. The method of claim 11, further comprising halting adaptation of the first adaptive filter in response to detecting that the source audio is predominantly a tone.

13. The method of claim 11, further comprising:

detecting that the source audio no longer is predominantly a tone; and responsive to detecting that the source audio no longer is predominantly a tone, sequencing adaptation of the secondary path adaptive filter and the first adaptive filter so that adaptation of a first one of the first adaptive filter or the secondary path adaptive filter is initiated only after adaptation of another one of the first adaptive filter or the secondary path adaptive filter is substantially completed or halted.

14. The method of claim 13, wherein the sequencing sequences adaptation of the secondary path adaptive filter and the first adaptive filter such that adaptation of the secondary path adaptive filter is performed prior to adaptation of the first adaptive filter and while adaptation of the first adaptive filter is halted.

15. The method of claim 11, wherein the detecting detects a tone in the source audio using adaptive decision criteria for determining at least one of when the tone has been detected and when normal operation can be resumed after a non-tonal signal has been detected.

16. The method of claim 15, further comprising:

incrementing a persistence counter in response to determining that the tone is present; and determining that the tone has been detected when the persistence counter exceeds a threshold value.

17. The method of claim 16, further comprising:

responsive to determining that the tone has been detected, setting a hangover count to a predetermined value;

responsive to subsequently determining that the tone is absent and only if source audio of sufficient audio is present, decrementing the hangover counter; and responsive to the hangover count being decremented to zero, indicating that normal operation can be resumed.

18. The method of claim 11, further comprising responsive to detecting a number of tones, resetting adaptation of the secondary path adaptive filter so that an amount of deviation of coefficients of the secondary path adaptive filter due to adapting to initial portions of the number of tones is reduced.

19. An integrated circuit for implementing at least a portion of a personal audio device, comprising:

an output for providing an output signal to an output transducer including both source audio for playback to a listener and an anti-noise signal for countering the effects of ambient audio sounds in an acoustic output of the transducer;

a reference microphone input for receiving a reference microphone signal indicative of the ambient audio sounds;

an error microphone input for receiving an error microphone signal indicative of the acoustic output of the transducer and the ambient audio sounds at the transducer; and a processing circuit that adaptively generates the anti-noise signal from the reference microphone signal by adapting a first adaptive filter to reduce the presence of the ambient audio sounds heard by the listener in conformity with an error signal and the reference microphone signal, wherein the processing circuit implements a secondary path adaptive filter having a secondary path response that shapes the source audio and a combiner that removes the source audio from the error microphone signal to provide the error signal, wherein the processing circuit detects a frequency-dependent characteristic of the source audio that is independent of the ambient audio sounds using frequency selective filtering of the source audio and takes action to prevent improper generation of the anti-noise signal in response to detecting the characteristic of the source audio.

20. The integrated circuit of claim 19, wherein the processing circuit halts adaptation of the secondary path adaptive filter in response to detecting that the source audio is predominantly a tone.

21. The integrated circuit of claim 20, wherein the processing circuit further halts adaptation of the first adaptive filter in response to detecting that the source audio is predominantly a tone.

22. The integrated circuit of claim 20, wherein the processing circuit, in response to detecting that the source audio no longer is predominantly a tone, sequences adaptation of the secondary path adaptive filter and the first adaptive filter so that adaptation of a first one of the first adaptive filter or the secondary path adaptive filter is initiated only after adaptation of another one of the first adaptive filter or the secondary path adaptive filter is substantially completed or halted.

23. The integrated circuit of claim 22, wherein the processing circuit sequences adaptation of the secondary path adaptive filter and the first adaptive filter such that adaptation of the secondary path adaptive filter is performed prior to adaptation of the first adaptive filter and while adaptation of the first adaptive filter is halted.

24. The integrated circuit of claim 20, wherein the processing circuit detects a tone in the source audio using a tone detector that has adaptive decision criteria for determining at least one of when the tone has been detected and when normal operation can be resumed after a non-tonal signal has been detected.

25. The integrated circuit of claim 24, wherein the tone detector increments a persistence counter in response to determining that the tone is present, and wherein the tone detector determines that the tone has been detected when the persistence counter exceeds a threshold value.

26. The integrated circuit of claim 25, wherein the tone detector, in response to determining that the tone has been detected, sets a hangover count to a predetermined value and decrements the hangover counter in response to subsequently determining that the tone is absent and only if source audio of sufficient audio is present, and wherein the tone detector indicates that normal operation can be resumed when the hangover count reaches zero.

27. The integrated circuit of claim 20, wherein the processing circuit, in response to detecting a number of tones, resets adaptation of the secondary path adaptive filter, so that an amount of deviation of coefficients of the secondary path adaptive filter due to adapting to initial portions of the number of tones is reduced.

* * * * *